(12) United States Patent
Burcklen et al.

(10) Patent No.: US 12,339,477 B2
(45) Date of Patent: Jun. 24, 2025

(54) AMORPHOUS OR NANOCRYSTALLINE MOLYBDENUM NITRIDE AND SILICON NITRIDE MULTILAYERS

(71) Applicant: Lawrence Livermore National Security, LLC, Livermore, CA (US)

(72) Inventors: Catherine Burcklen, Oakland, CA (US); Tommaso Pardini, Oakland, CA (US); Regina Soufli, Berkeley, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 325 days.

(21) Appl. No.: 16/883,787

(22) Filed: May 26, 2020

(65) Prior Publication Data

US 2021/0373212 A1 Dec. 2, 2021

(51) Int. Cl.
| | | |
|---|---|---|
| *C23C 14/06* | (2006.01) | |
| *C23C 14/00* | (2006.01) | |
| *C23C 14/35* | (2006.01) | |
| *G02B 5/08* | (2006.01) | |
| *G02B 5/28* | (2006.01) | |
| *G03F 7/00* | (2006.01) | |

(52) U.S. Cl.
CPC .......... *G02B 5/285* (2013.01); *C23C 14/0036* (2013.01); *C23C 14/0641* (2013.01); *C23C 14/0652* (2013.01); *C23C 14/35* (2013.01); *G02B 5/0891* (2013.01); *G02B 5/283* (2013.01); *G03F 7/70958* (2013.01)

(58) Field of Classification Search
CPC ............ C23C 14/0036; C23C 14/0641; C23C 14/0652; C23C 14/35; G02B 5/0891; G02B 5/283; G02B 5/285; G03F 7/70958
See application file for complete search history.

(56) References Cited

U.S. PATENT DOCUMENTS

| | | | | |
|---|---|---|---|---|
| 4,471,004 A | * | 9/1984 | Kim | ............... H01L 21/321 438/785 |
| 5,015,353 A | * | 5/1991 | Hubler | ............... C23C 14/22 427/527 |
| 5,681,761 A | * | 10/1997 | Kim | ............... H01L 29/66772 257/E21.415 |

(Continued)

FOREIGN PATENT DOCUMENTS

| | | | | |
|---|---|---|---|---|
| DE | 102013112532 A1 | * | 5/2015 | .......... F24S 70/20 |
| JP | 4394466 B2 | * | 1/2010 | |

OTHER PUBLICATIONS

English Translation of Yoshimura JP 4394466 B2 (Year: 2024).*
International Search Report and Written Opinion from PCT Application No. PCT/US2021/029759, dated Aug. 25, 2021.

(Continued)

*Primary Examiner* — Ryan S Dunning
(74) *Attorney, Agent, or Firm* — Zilka-Kotab, P.C.

(57) ABSTRACT

A multilayer film structure, and method of making such a multilayer film structure, which includes a first layer consisting essentially of a first material and a second layer consisting essentially of a second material. In embodiments, the multilayer film structure includes a plurality of first layers alternating with a plurality of second layers. The layers are constructed by applying a $N_2$-based reactive sputtering methodology so that the layers maintain a largely amorphous microstructure and a stable and high reflectivity upon annealing at temperatures up to 800° C. for 1 hour.

21 Claims, 7 Drawing Sheets

(56) References Cited

U.S. PATENT DOCUMENTS

| | | | | |
|---|---|---|---|---|
| 6,078,425 | A * | 6/2000 | Wolfe | G02B 5/0858 359/884 |
| 6,309,780 | B1 | 10/2001 | Smith | |
| 7,534,402 | B2 * | 5/2009 | Morse | B01J 19/0093 422/198 |
| 7,618,500 | B2 * | 11/2009 | Farmer | C23C 28/3455 148/403 |
| 7,672,430 | B2 * | 3/2010 | Chapman | G01J 1/0455 378/71 |
| 7,744,830 | B2 * | 6/2010 | Morse | H01M 8/0631 422/131 |
| 7,851,203 | B2 * | 12/2010 | Letant | B01D 67/0093 435/287.1 |
| 7,855,018 | B2 * | 12/2010 | Sopchak | H01M 8/086 429/477 |
| 7,920,323 | B2 | 4/2011 | Benoit et al. | |
| 7,986,455 | B2 | 7/2011 | Feigl et al. | |
| 8,142,691 | B2 * | 3/2012 | Hill | G21K 1/06 264/1.7 |
| 8,338,166 | B2 * | 12/2012 | Beer | C12Q 1/6888 435/283.1 |
| 8,416,829 | B1 | 4/2013 | Soufli et al. | |
| 8,512,588 | B2 * | 8/2013 | Tringe | B82Y 40/00 216/2 |
| 8,811,445 | B2 * | 8/2014 | Deri | H01S 5/02326 372/50.23 |
| 9,207,194 | B2 * | 12/2015 | Baker | G01N 23/025 |
| 9,366,574 | B2 * | 6/2016 | Pereverzev | G01J 3/021 |
| 9,706,646 | B2 * | 7/2017 | Jiang | H05K 1/148 |
| 9,999,363 | B2 * | 6/2018 | Shah | A61N 1/37229 |
| 10,123,380 | B2 * | 11/2018 | Beer | H05B 6/806 |
| 11,262,514 | B2 * | 3/2022 | Patra | G02B 6/4274 |
| 2002/0069911 | A1 * | 6/2002 | Nakamura | H01L 31/202 136/243 |
| 2004/0094756 | A1 * | 5/2004 | Moon | H01L 21/02513 257/E21.112 |
| 2007/0166970 | A1 * | 7/2007 | Triyoso | H01L 29/6659 438/585 |
| 2007/0281109 | A1 | 12/2007 | Bijkerk et al. | |
| 2008/0266651 | A1 | 10/2008 | Murakami et al. | |
| 2009/0009858 | A1 | 1/2009 | Feigl et al. | |
| 2009/0302750 | A1 * | 12/2009 | Jun | H10K 50/858 313/504 |
| 2013/0314773 | A1 | 11/2013 | Schreiber et al. | |
| 2014/0268081 | A1 * | 9/2014 | Hofmann | C23C 14/165 430/5 |
| 2016/0001232 | A1 * | 1/2016 | Bond | G03F 7/0002 29/623.5 |
| 2016/0011345 | A1 * | 1/2016 | Hofmann | G02B 5/0833 359/359 |
| 2016/0012929 | A1 | 1/2016 | Kuznetsov et al. | |
| 2019/0048158 | A1 * | 2/2019 | Stadermann | B05D 3/107 |
| 2020/0412083 | A1 * | 12/2020 | Patra | H01L 23/5226 |

OTHER PUBLICATIONS

Stearns et al., "Thermally induced structural modification of Mo—Si multilayers," Journal of Applied Physics, vol. 67, No. 5, Mar. 1990, pp. 2415-2427.

Ijdiyaou et al., "On the formation of molybdenum silicides in Mo—Si multilayers: the effect of Mo thickness and annealing temperature," Applied Surface Science, vol. 55, 1992, pp. 165-171.

Pardini et al., "Aperiodic Mo/Si multilayers for hard X-rays," Optics Express, vol. 24, No. 16, Aug. 8, 2016, pp. 18642-18648.

Bottger et al., "Thermal stability of Mo/Si multilayers with boron carbide interlayers," Thin Solid Films, vol. 444, 2003, pp. 165-173.

Ishii et al., "Thermal stability of Mo-based multilayer x-ray mirrors," Proceedings of the SPIE, vol. 2015, Feb. 1994, pp. 132-141.

Burcklen et al., "Depth-graded Mo/Si multilayer coatings for hard x-rays," Optics Express, vol. 27, No. 5, Feb. 27, 2019, pp. 7291-7306.

Feigl et al., "Magnetron sputtered EUV mirrors with high-thermal stability," Proceedings of SPIE vol. 3997, Emerging Lithographic Technologies IV, Jul. 21, 2000, pp. 420-430.

Windt, D., "Reduction of stress and roughness by reactive sputtering in W/B4C X-ray multilayer films," Proceedings of SPIE vol. 6688, 2007, pp. 66880R-1-66880R-10.

Wen et al., "Improvement of interface structure and polarization performance of Co/C multilayers by incorporation of nitrogen," Optics Express, vol. 24, No. 24, Nov. 14, 2016, pp. 27166-27176.

Eriksson et al., "Reflectivity and structural evolution of Cr/Sc and nitrogen containing Cr/Sc multilayers during thermal annealing," Journal of Applied Physics, vol. 104, No. 063516, pp. 063516-1-063516-10.

Nakajima et al., "Interdiffusion and structural relaxation in Mo/Si multilayer films," Journal of Applied Physics, vol. 63, No. 4, Feb. 15, 1998, pp. 1046-1051.

Sobierajski et al., "Damage mechanisms of MoN/SiN multilayer optics for next-generation pulsed XUV light," Optics Express, vol. 19, No. 1, Jan. 3, 2011, pp. 193-205.

Kazama et al., "Preparation and Magnetic Properties of Amorphous Superlattice," Science reports of the Research Institutes, Tohoku University. Ser. A, Physics, chemistry and metallurgy, vol. 32, No. 2, Mar. 26, 1985, pp. 141-153.

Extended European Search Report from European Application No. 21813603.4, dated Jun. 6, 2024, 16 pages.

Zhang et al., "Microstructure, mechanical and tribological behavior of MoNx/SiNx multilayer coatings prepared by magnetron sputtering," Applied Surface Science, vol. 274, 2013, pp. 231-236.

Wang et al., "Amorphous molybdenum nitride thin films prepared by reactive sputter deposition," Materials Sciene & Engineering B, vol. 112, 2004, pp. 42-49.

Liang et al., "Modulation effect on mechanical properties of nanolayered MoN/MoSiN coatings," Surface & Coating Technology, vol. 436, 2022, pp. 1-7.

Lobl et al., "Thermal stability of nonstoichiometric silicon nitride films made by reactive de magnetron sputter deposition," Thin Solid Films, vol. 317, 1998, pp. 153-156.

* cited by examiner

AMORPHOUS OR NANOCRYSTALLINE MOLYBDENUM NITRIDE AND SILICON NITRIDE MULTILAYERS

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to reactive sputtering, and more particularly, this invention relates to using reactive sputtering to enhance thermal stability while maintaining high reflectivity in molybdenum/silicon (Mo/Si) multilayer interference coatings.

BACKGROUND

The fields of reflective, transmissive, and diffractive optics as well as other technologies involving photon energies from the extreme ultraviolet (EUV) to the hard x-ray regions could greatly benefit from multilayer structures with high reflectivity and high thermal stability. Reactively sputtered multilayers have the potential to offer high reflectivity (or transmittance), low stress, and high thermal stability and thus can be useful in a wide range of applications in the spectral range from the EUV to the hard x-ray. Applications include EUV lithography, solar and planetary physics, EUV/x-ray lasers, astronomy, synchrotron instrumentation, attosecond physics, plasma physics, target diagnostics, etc.

Mo/Si multilayer coatings have been extensively studied and employed for short-wavelength applications. Mo/Si is used in mirror and mask coatings for EUV photolithography systems (e.g., operating at about 92 electronvolt (eV) photon energy) as well as for attosecond science and solar physics in the photon energy region from 15 eV to 92 eV. Recent studies [T. Pardini, et al., Opt. Express 24, 18642-18648 (2016), C. Burcklen, et al., Opt. Express 27, 7291-7306 (2019)] demonstrate that Mo/Si is a high performance reflective coating for the hard x-ray region (e.g., photon energies between about 8 kiloelectronvolt (keV) and 17 keV).

Nakajima, et al. ["Interdiffusion and structural relaxation in Mo/Si multilayer films." *Journal of Applied Physics* 63, 1046-1051 (1988).] discloses $Mo_{1-x}N_x/Si_{1-y}N_y$ multilayer films prepared with nitrogen (e.g., $N_2$) introduced via reactive sputtering. The structure of these films (e.g., the thickness and crystallinity) of the layers and the associated interfaces were studied at room temperature and under annealing conditions. As shown in Table 1 of Nakajima, et al., the $Mo_{1-x}N_x/Si_{1-y}N_y$ multilayer films changed phase to become crystalline $\beta$-$Mo_2N$/$\alpha$-$Si_3N_4$ multilayer films after annealing between 923 K and 1027 K (e.g., 649.85° C. to 753.85° C.), where $\beta$-$Mo_2N$ and $\alpha$-$Si_3N_4$ have a tetragonal and hexagonal lattice structure, respectively. See Nakajima et al., p. 1047. The films exhibited crystallinity at elevated temperatures suggesting increased roughness at the layer interfaces, likely leading to low reflectivity. The authors also found a change in layer thickness (likely caused by interdiffusion between layers) after annealing, which, in the case of a multilayer coating operating as reflective element, would result in a shift of the photon energy of operation and in decreased reflectivity. The films in Nakajima, et al., were not developed as reflective elements for any photon energy and the reflectivity was not measured in this paper before or after annealing.

$Mo_{1-x}N_x/Si_{1-y}N_y$ multilayers have been fabricated for a radiation damage experiment at the FLASH (Free Electron Laser in Hamburg) facility. Different deposition methods were employed resulting in crystalline and granular $Mo_{1-x}N_x$ layers with dramatically reduced $Mo_{1-x}N_x/Si_{1-y}N_y$ reflectivity even at room temperature. Specifically, the Mo layers were deposited by e-beam evaporation and the Si layers were deposited via magnetron sputtering where $N_2$ was introduced via ion-beam sputtering. The reflectivity of these $Mo_{1-x}N_x/Si_{1-y}N_y$ multilayers was measured at near-normal incidence at 92 eV at room-temperature and was found to be around 26%. This reflectivity is considered to be too low to be practical for real-world applications, especially considering that Mo/Si-based multilayer coatings have been demonstrated to have at least 60% reflectivity at around 92 eV. The low reflectivity of these $Mo_{1-x}N_x/Si_{1-y}N_y$ multilayer coatings could be due, at least in part, to increased crystallinity found in the $Mo_{1-x}N_x$ layers (e.g., presumably due to the e-beam deposition method with $N_2$ ion beam sputtering) which results in higher roughness at the $Mo_{1-x}N_x/Si_{1-y}N_y$ layer interfaces and therefore a dramatic reduction in reflectivity. Another reason could be diffusion at the layer interfaces, which reduces optical contrast and results in reduction of reflectivity. The $Mo_{1-x}N_x/Si_{1-y}N_y$ coating was annealed up to 900° C. and the structure (e.g., the thickness and crystallinity) of the layers was studied but the reflectivity was not evaluated above room temperature. After annealing, a change in crystallinity (phase change) was observed in the films.

Conventional Mo/Si coatings exhibit decreased reflectivity at temperatures above 100° C.-150° C., due at least in part to diffusion at the Mo and Si layer interfaces and/or significantly increased crystallinity following annealing. Some methods to improve the thermal stability of Mo/Si multilayers include the introduction of barrier layers (e.g., $B_4C$, carbon, etc.) at the interfaces between the Mo and Si layers, which have resulted in experimentally demonstrated thermal stability up to 400° C. Benoit, et al. [U.S. Pat. No. 7,920,323 B2] theoretically propose the introduction of silicon boride or silicon nitride interface barrier layers as a means to increase the thermal stability of Mo/Si multilayers above 300° C., at photon energies of operation around 92 eV (13.5 nanometers (nm) wavelength).

Prior attempts to fabricate Mo/Si multilayer coatings (e.g., described in detail above) for applications involving the EUV spectrum achieved thermal stability up to 400° C. Specifically, the results found in prior attempts include diffusion at interfaces and/or increased crystallization and roughness of layers at increased temperatures, which significantly reduce the reflectivity. Furthermore, conventional free-standing films with crystalline layers have limited mechanical strength and flexibility, especially at elevated temperatures. Crystallinity is typically not a desirable property in free standing films, multilayers, etc.

Other than Mo/Si, various multilayer coating systems have been studied under high temperature conditions. Multilayer coatings containing carbides (e.g., $Mo_2C$, SiC, $B_4C$, etc.) have typically higher thermal stability than non-carbide containing multilayer systems due to superior stability at the layer interfaces. The most highly reflective and thermally stable multilayer coating reported is $Mo_2C/Si$ with a normal incidence reflectivity of about 60% (measured at 92 eV photon energy) which remains stable up to 500° C. [T. Feigl, et al., Proc. SPIE 3997 (2000)]. Feigl et al. [U.S. Pat. No.

7,986,455 B2] also theoretically propose $Mo_xN_y/Si$ and $Mo/Si_xB_y$ multilayer coatings as having the potential to achieve thermal stability above 300° C., at photon energies of operation around 92 eV.

Reactive sputtering has been used in the deposition of $W/B_4C$, Cr/Sc, and Co/C multilayer coatings at short wavelengths as a method to reduce multilayer thin film stress and improve reflectivity. All prior research and publications devoted to the effect of reactive sputtering on multilayer reflectivity at elevated temperatures have been directed to Cr/Sc. The Cr/Sc coatings were found to be stable only up to 300° C.

SUMMARY

A product, according to one general embodiment, includes a first layer consisting essentially of $Mo_{1-x}N_x$, where x=0 to 0.8, and a second layer consisting essentially of $Si_{1-y}N_y$, where y=0 to 0.8. In the layers, x>0 when y=0 and y>0 when x=0.

A product, according to another general embodiment, includes a layer consisting essentially of $Mo_{1-x}N_x$, where x=0 to 0.8. The layer is characterized by exhibiting a nominal change in reflectivity upon annealing at 800° C. for 1 hour.

A product, according to another general embodiment, includes a layer consisting essentially of $Si_{1-y}N_y$, where y=0 to 0.8. The layer is characterized by exhibiting a nominal change in reflectivity upon annealing at 800° C. for 1 hour.

A method, according to yet another general embodiment, includes forming a first layer and a second layer using a magnetron sputtering machine. The first layer consists essentially of $Mo_{1-x}N_x$, where x=0 to 0.8. The second layer consists essentially of $Si_{1-y}N_y$, where y=0 to 0.8. In the layers, x>0 when y=0 and y>0 when x=0. The first layer and the second layer are each characterized as maintaining a substantially amorphous nature upon annealing at 800° C. for 1 hour.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. The term "about" as used herein indicates the value preceded by the term "about," along with any values reasonably close to the value preceded by the term "about," as would be understood by one of skill in the art. When not indicated otherwise, the term "about" denotes the value preceded by the term "about" ±10% of the value. For example, "about 10" indicates all values from and including 9.0 to 11.0.

The following description discloses several preferred configurations of $Mo_{1-x}N_x/Si_{1-y}N_y$ multilayer interference coatings, according to various aspects of the present invention, as well as processes using reactive sputtering to enhance thermal stability while maintaining high reflectivity in $Mo_{1-x}N_x/Si_{1-y}N_y$ multilayer interference coatings, and/or related systems and methods.

Figure 1:
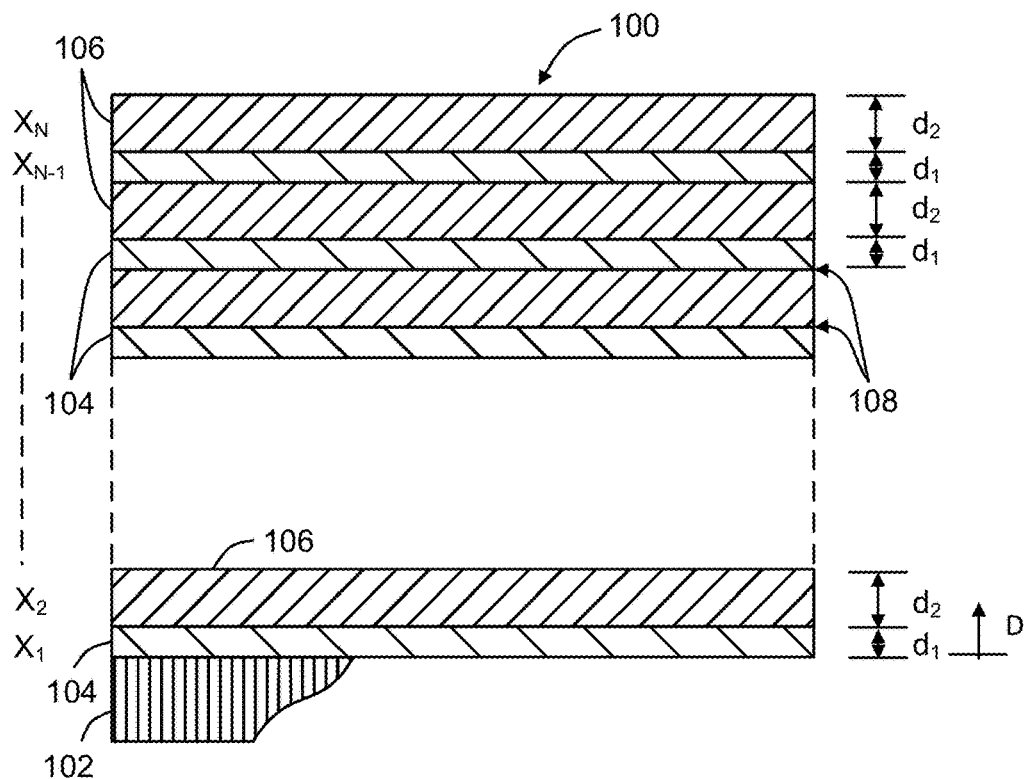
FIG. 1 is a cross-sectional view of a multilayer having a periodic construction, according to one illustrative configuration of the present invention.
Figure 2:
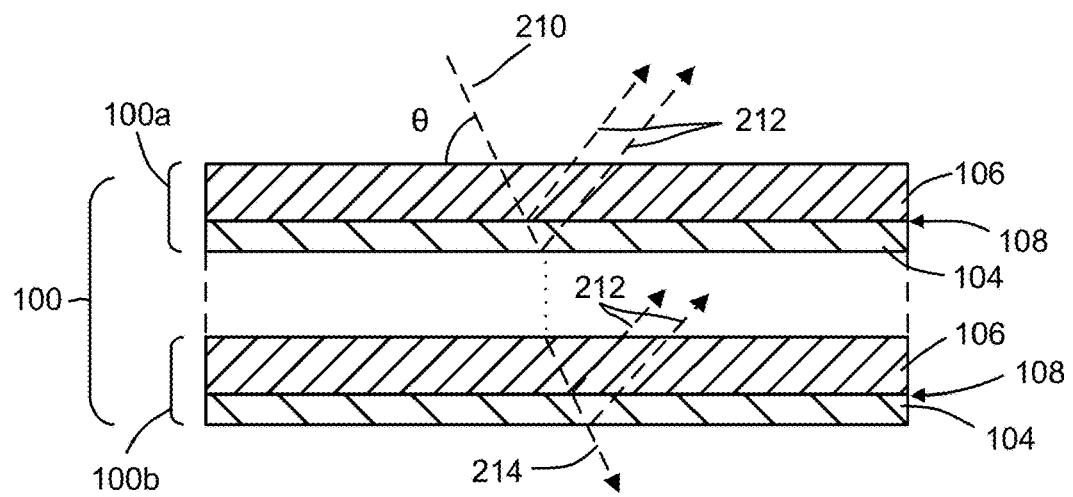
FIG. 2 is a schematic of a multilayer illustrating transmission and reflectivity behavior of the multilayer, according to one illustrative configuration of the present invention.

In at least some aspects, a multilayer stack comprises alternate layers $X_1$-$X_N$ of materials such as $Mo_{1-x}N_x$ and $Si_{1-y}N_y$. The number and configurations of the layers are selected to provide a desired spectral response (e.g., reflectivity profile and/or transmissivity profile) of the multilayer, such as by applying Bragg's law. Referring to FIGS. 1 and 2, a multilayer 100 is constructed from a plurality of bilayers 100a, 100b and can be supported by a substrate 102, such as silicon, glass, a membrane, mesh, etc.; or constructed as a thin-film without a substrate. Each bilayer is formed by a $Mo_{1-x}N_x$ layer 104 adjacent a $Si_{1-y}N_y$ layer 106, and the adjacent layers are coupled at an interface 108.

The thicknesses of the layers 104, 106 and the physical characteristics of the interfaces 108 can be controlled to provide a desired spectral response. As shown in FIG. 2, multilayer 100 can be subjected to incident light 210 directed toward multilayer 100 and oriented at an incidence angle θ. The incident light 210 can be converted into reflected light 212 and transmitted light 214 by the interaction with the multilayer 100, and that conversion defines the spectral response of the multilayer 100. Throughout exemplary multilayer 100, the $Mo_{1-x}N_x$ layers 104 all have a common thickness $d_1$. Similarly, the $Si_{1-y}N_y$ layers 106 all have a common thickness $d_2$. As a result, the bilayer structure is repeated throughout multilayer 100 so that multilayer 100 has a periodic construction. The thicknesses $d_1$ and $d_2$ of the $Mo_{1-x}N_x$ and $Si_{1-y}N_y$ layers can be the same or different.

Figure 3:
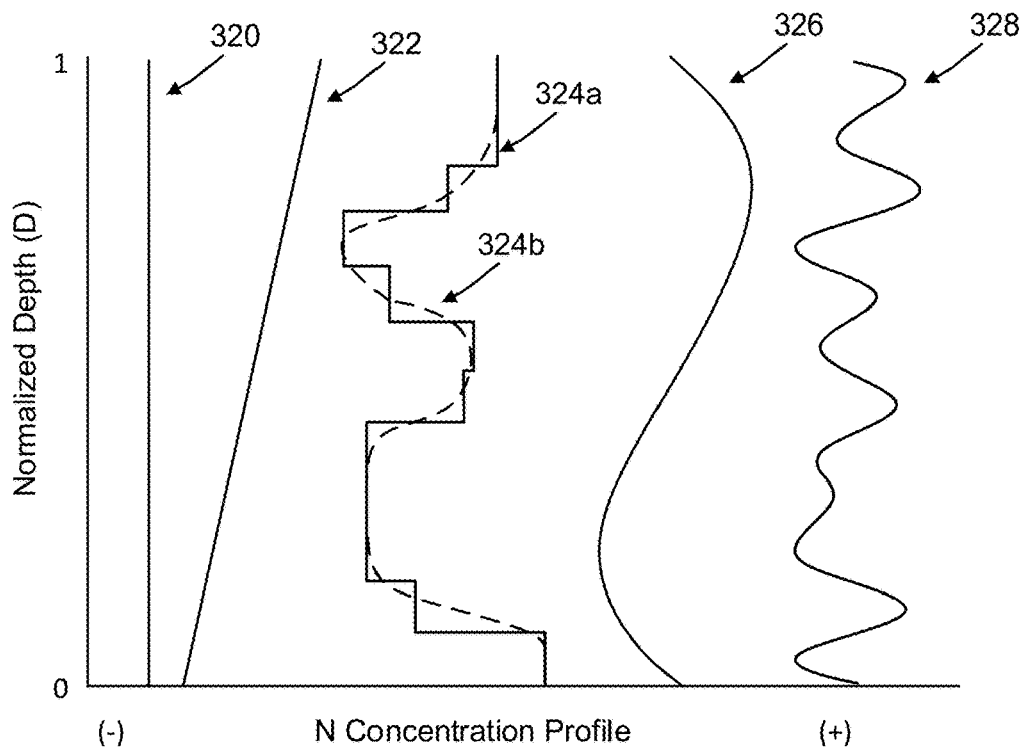
FIG. 3 is a schematic showing exemplary nitrogen concentration profiles in a multilayer, according to various configurations of the present invention.

The concentration of nitrogen gas ($N_2$) included in a process gas can be selected, and/or varied, during the deposition of the $Mo_{1-x}N_x$ and/or the $Si_{1-y}N_y$ layers to tune the nitrogen concentration throughout the multilayer 100. As referred to throughout the present disclosure, "$Mo_{1-x}N_x$" and "$Si_{1-y}N_y$," indicate that a certain amount of nitrogen (e.g., N) is present in each of the molybdenum layers 104 and silicon layers 106, respectively. The concentration of nitrogen can be constant or varied throughout the multilayer structure. Referring to FIG. 3, exemplary nitrogen (N) profiles illustrating the nitrogen concentration relative to normalized depth (D) into the thickness of the multilayer structure are graphed. The profiles have been shifted along the X-axis to illustrate relative nitrogen concentrations within a given profile but are not intended to demonstrate relative nitrogen concentrations between the various profiles. The profiles can be described by a straight, stepped, curved, cyclic line, or any other shape selected to provide a desired behavior of the multilayer so that a desired spectral response combined with the highest achievable thermal stability and the lowest thin film stress can be achieved. For example, an N profile 320 demonstrates that the N profile can be a straight line through the depth of the multilayer, with the nitrogen concentration constant. In another example, an N profile 322 demonstrates another straight-line profile in which the nitrogen concentration changes linearly through the depth of the multilayer. It should be appreciated that while N profile 322 illustrates a nitrogen concentration increasing with depth in the multilayer, in other examples the nitrogen concentration can decrease linearly with depth in the multilayer. Nitrogen profile 324a is an exemplary stepped profile in which the N concentration is varied stepwise through the multilayer. In a related embodiment, the N concentration can be selected having a step corresponding to each layer throughout the $Mo_{1-x}N_x$ and $Si_{1-y}N_y$ layers, and some of the layers can have the same N concentration. As shown by N profile 324b, a stepped profile can be used to approximate a desired curved nitrogen profile by using the steps to discretize the desired curved N profile. The N profile can alternatively have a cyclic profile shape, such as a sinusoidal curve shape. As shown by profile 326, the N profile can be shaped as a sinusoidal curve having a wavelength comparable to the thickness of the multilayer. In another cyclic example, shown by N profile 328, the shape of the cyclic profile can vary through the depth of the multilayer, such as by having a varied amplitude and/or wavelength. Illustrative values for x and y are presented below.

Figure 4:
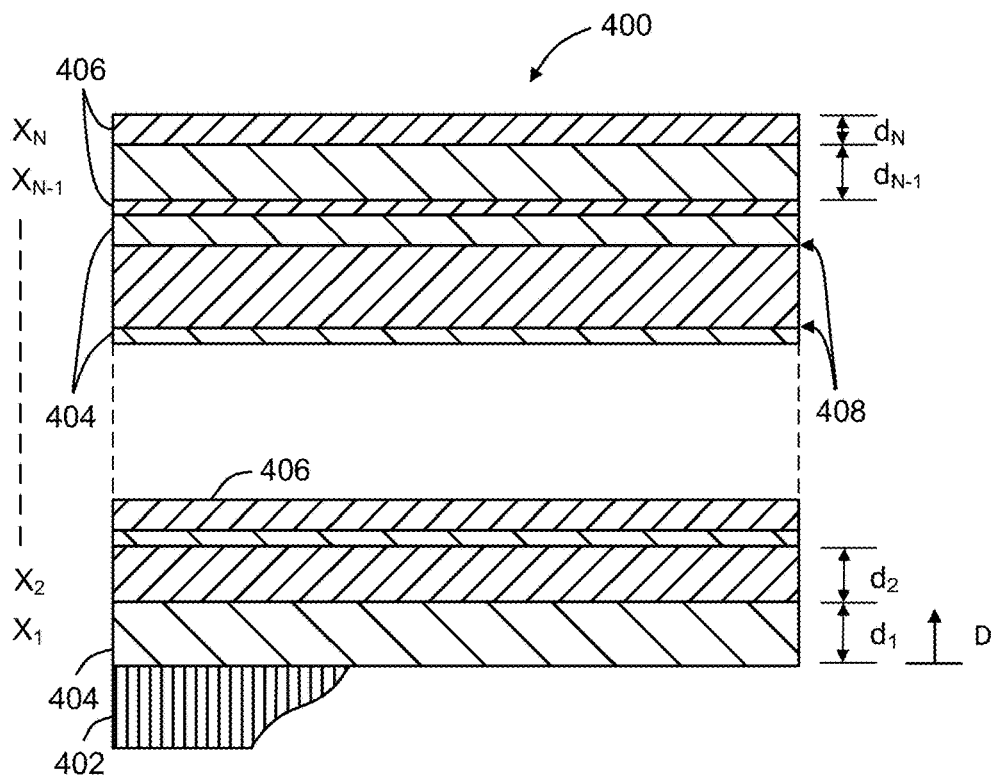
FIG. 4 is a cross-sectional view of a multilayer having an aperiodic construction, according to one illustrative configuration of the present invention.

Referring to FIG. 4, another exemplary embodiment of a multilayer is described in which the multilayer has an aperiodic construction. As shown, multilayer 400 is constructed from alternate $Mo_{1-x}N_x$ and $Si_{1-y}N_y$ layers, 404 and 406, respectively. Multilayer 400 can be supported by a substrate 402, such silicon, glass, a membrane, mesh, etc.; or constructed as a thin-film without a substrate. Each $Mo_{1-x}N_x$ layer 404 is coupled to a $Si_{1-y}N_y$ layer 406 at an interface 408. The thicknesses $d_1$-$d_N$ of the layers 404, 406 are varied throughout the multilayer, so that the thicknesses of the $Mo_{1-x}N_x$ layers 404 vary and the thicknesses of the $Si_{1-y}N_y$ layers 406 vary. The thicknesses $d_1$-$d_N$ of the layers 404, 406 are selected to tune the desired spectral response of the multilayer 400. The nitrogen concentration in multilayer 400 can be the same as those described above with regard to FIG. 3. Namely, the nitrogen concentration can have a profile that is linear, stepped, curved, cyclic, or any other shape, throughout multilayer 400.

As described above, the $Mo_{1-x}N_x$ layers can have constant or varying thickness and the $Si_{1-y}N_y$ layers can have constant or varying thickness throughout the stack to tune the breadth of the spectral response of the multilayer. For example, a multilayer having a periodic construction can be selected to provide a narrower spectral response, while an aperiodic construction can be selected to provide a broader spectral response. In one approach, the thickness of a layer and/or a multilayer structure may be any value within a range spanning from a fraction of one micron to several millimeters. In some approaches, the thickness of a layer may be about 2 angstroms (Å), 4 Å, 6 Å, or greater. The desired thickness of a layer and/or the multilayer structure may be readily determinable by one having ordinary skill in the art depending on the intended application in view of the present disclosure. In one approach, each sub-layer of a repeating set, e.g., a repeating bilayer, may have a thickness on the nanometer scale, e.g., in the range from about 1 nm to about 100 nm. Similarly, in another approach, within each repeating set of sub-layers, the thickness of the layers may be the same or different. Moreover, the thicknesses of the layers in a given set may differ from the thicknesses of some, or all of the sub-layers of other sets. In at least one embodiment of a multilayer, the thickness of each $Mo_{1-x}N_x$ layer is in a range between about 1.00 nm and about 1.50 nm, and the thickness of each $Si_{1-y}N_y$ layer is in a range between about 1.50 nm and about 2.00 nm. In another example of a multilayer, the thickness of each $Mo_{1-x}N_x$ layer is about 2.80 nm, and the thickness of each $Si_{1-y}N_y$ layer is about 4.1 nm, resulting in a bilayer having a thickness of about 6.9 nm. In a still further embodiment, a multilayer can be constructed having 81 layers and an overall thickness (i.e., depth) of about 280 nm.

In one general approach, a product includes a first layer consisting essentially of $Mo_{1-x}N_x$, where x=0 to 0.8 and a second layer consisting essentially of $Si_{1-y}N_y$, where y=0 to 0.8. In the layers, x>0 when y=0 and y>0 when x=0.

In another general approach, a product includes a layer consisting essentially of $Mo_{1-x}N_x$, where x=0 to 0.8. The layer is characterized by exhibiting a nominal change in reflectivity upon annealing at 800° C. for 1 hour.

In another general approach, a product includes a layer consisting essentially of $Si_{1-y}N_y$, where y=0 to 0.8. The layer is characterized by exhibiting a nominal change in reflectivity upon annealing at 800° C. for 1 hour.

In yet another general approach, a method includes forming a first layer and a second layer using a magnetron sputtering machine. The first layer consists essentially of $Mo_{1-x}N_x$, where x=0 to 0.8. The second layer consists essentially of $Si_{1-y}N_y$, where y=0 to 0.8. In the layers, x>0 when y=0 and y>0 when x=0. The first layer and the second layer are each characterized as maintaining a substantially amorphous nature upon annealing at 800° C. for 1 hour.

Various approaches described herein disclose the use of reactive sputtering to enhance thermal stability while maintaining high reflectivity in Mo/Si multilayer interference coatings. For example, the $Mo_{1-x}N_x/Si_{1-y}N_y$ multilayers fabricated according to the approaches disclosed herein exhibit substantially amorphous layers and stable layer interfaces and maintain high reflectivity after exposure to a temperature of 800° C. for 1 hour. This is believed to be the highest thermal stability recorded for multilayers operating in the EUV to hard x-ray spectral regions. The $Mo_{1-x}N_x/Si_{1-y}N_y$ multilayers fabricated according to at least some of the approaches described herein may be used for applications including EUV lithography, solar physics, astronomy, attosecond physics, x-ray lasers, synchrotron instrumentation, plasma physics, target diagnostics, etc. Multilayer coatings having both high reflectivity and high stability at high temperatures are desired for the immediately preceding applications. To the inventors' knowledge, all prior attempts exhibit dramatic decrease in reflectivity above 500° C.

As used throughout the present disclosure, a relatively high reflectivity at near-normal incidence angles may be greater than 50% for EUV applications or applications having the same or substantially similar photon energy regions. Near-normal incidence may refer to the angle between a ray incident on a surface and a line perpendicular to the surface at the point of incidence (e.g., the normal). A near-normal incident angle is preferably about ±15 deg from the normal. In other approaches, a high reflectivity may depend on the spectral range, an angle of incidence, and/or the bandwidth of the application. For example, a high reflectivity at 17.4 keV photon energy may be 27% at grazing incidence angles between 0.5 deg and 0.6 deg, where the grazing direction is defined as the direction parallel to the surface. A high reflectivity may be readily determinable by one having skill in the art in view of the present disclosure and the intended application of the multilayers described herein.

As described throughout the present disclosure, materials having a high thermal stability may refer to materials which do not degrade at 800° C. Preferably, materials having a high thermal stability do not degrade at 800° C. when exposed for an hour or more. A $Mo_{1-x}N_x$ layer, a $Si_{1-y}N_y$ layer, and/or $Mo_{1-x}N_x/Si_{1-y}N_y$ multilayers as disclosed herein preferably maintain high reflectivity and remain thermally stable at 800° C. for at least 1 hour.

Various configurations of the inventive structures described herein are formed by a method employing reactive sputtering to enhance thermal stability and maintain high reflectivity in $Mo_{1-x}N_x/Si_{1-y}N_y$ multilayer interference coatings. The fabricated $Mo_{1-x}N_x/Si_{1-y}N_y$ multilayer structure exhibits amorphous layers and stable interfaces and maintains high reflectivity after exposure to a temperature of 800° C. for 1 hour, in at least one exemplary configuration.

At least some fabrication techniques described in detail herein produce multilayer coatings with simultaneously high reflectivity and high thermal stability via magnetron sputtering. Magnetron sputtering may include direct current (DC) or radio frequency (RF) magnetron sputtering with $N_2$ reactively incorporated as part of the process gas to produce dense and substantially amorphous $Mo_{1-x}N_x$ and $Si_{1-y}N_y$ layers in the multilayers, including smooth and stable interfaces resulting in improved reflectivity and high thermal stability. "Substantially amorphous" in the context of the present description is meant to be interpreted as at least a majority of the layer and/or multilayer being amorphous on a volume basis.

Figure 5A:
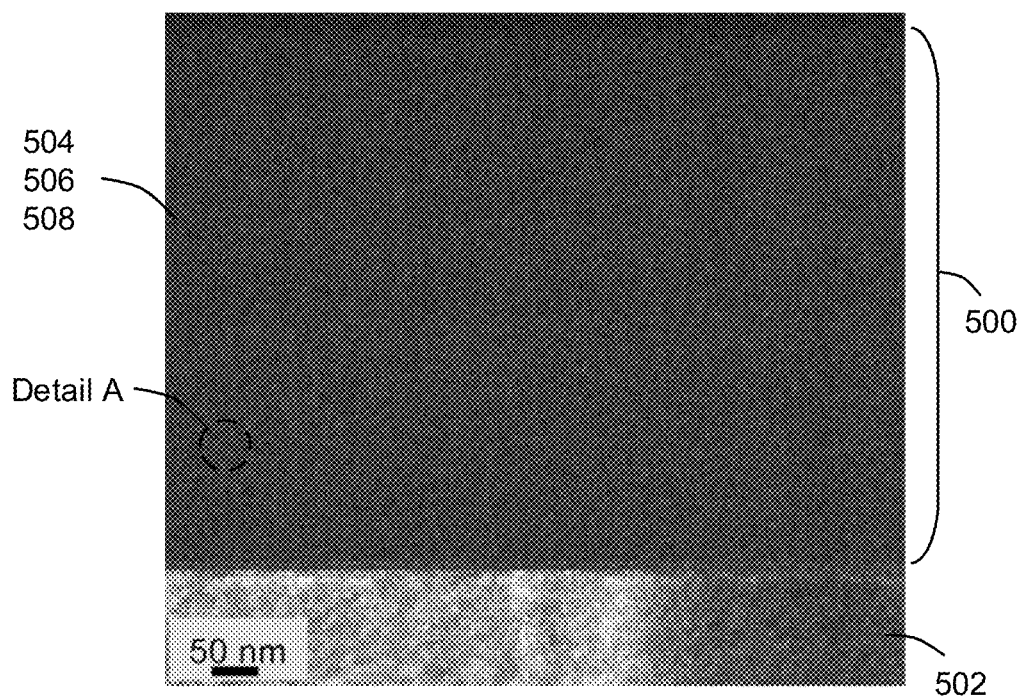
FIG. 5A is a cross-sectional image, obtained by transmission electron microscopy in dark field mode, of an aperiodic $Mo_{1-x}N_x/Si_{1-y}N_y$ multilayer before exposing the $Mo_{1-x}N_x/Si_{1-y}N_y$ multilayer to a temperature of 800° C. for 1 hour, according to one illustrative configuration of the present invention.
Figure 5B:
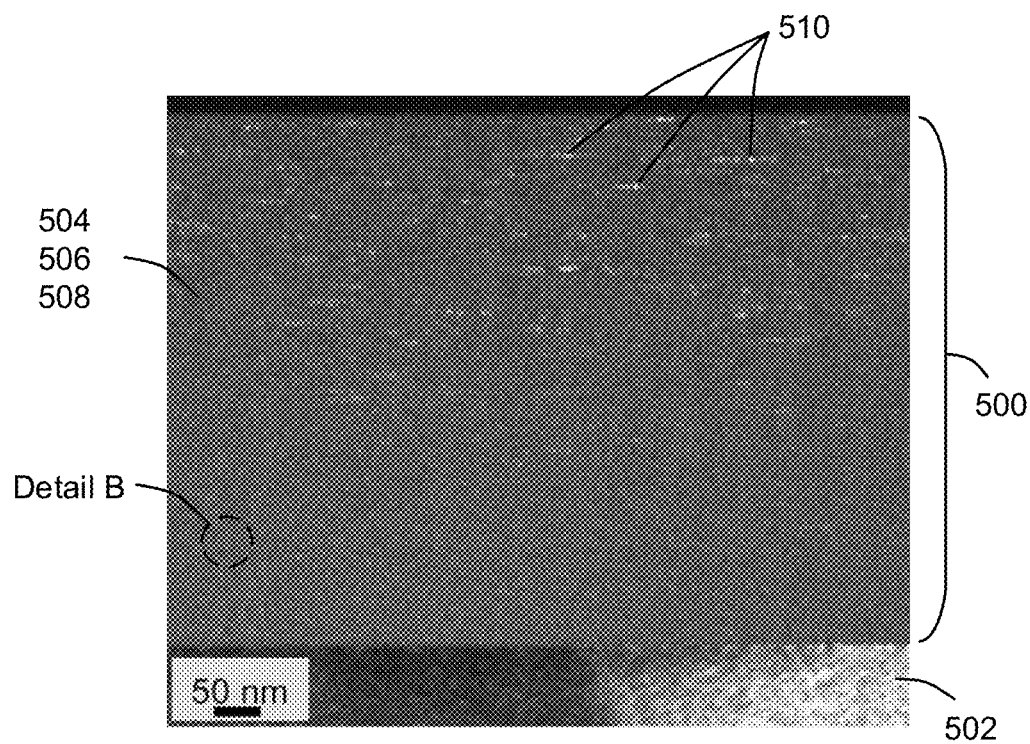
FIG. 5B is a cross-sectional image, obtained by transmission electron microscopy in dark field mode, of the aperiodic $Mo_{1-x}N_x/Si_{1-y}N_y$ multilayer of FIG. 5A after exposing the $Mo_{1-x}N_x/Si_{1-y}N_y$ multilayer to a temperature of 800° C. for 1 hour, according to one illustrative configuration of the present invention.

Referring to FIGS. 5A and 5B, cross-sectional images are shown of a sample multilayer 500 having an aperiodic construction and constructed on a substrate 502. The images were obtained by transmission electron microscopy "dark field" mode to inspect for, and highlight, any crystallinity present in a sample multilayer 500. The illustrated multilayer 500 is constructed from 150 $Mo_{1-x}N_x/Si_{1-y}N_y$ bilayers. In particular, multilayer is constructed from 150 $Mo_{1-x}N_x$ layers 504 alternating with 150 $Si_{1-y}N_y$ layers 506, and each $Mo_{1-x}N_x$ layer 504 engages an adjacent $Si_{1-y}N_y$ layer 506 at an interface 508. In the illustrated example, multilayer 500 has an aperiodic construction and includes $Mo_{1-x}N_x$ layers 504 having thicknesses in a range between about 12.2 Å and about 12.6 Å and $Si_{1-y}N_y$ layers 506 having thicknesses in a range between about 22.5 Å and about 30.8 Å. The total thickness of multilayer 500 is about 5640 Å (564 nm). FIG. 5A shows multilayer 500 before annealing by a exposing the $Mo_{1-x}N_x/Si_{1-y}N_y$ multilayer 500 to a temperature of 800° C. for 1 hour, in accordance with one aspect. FIG. 5B shows the same multilayer 500 after annealing by exposing the $Mo_{1-x}N_x/Si_{1-y}N_y$ multilayer 500 to a temperature of 800° C. for 1 hour, in accordance with one aspect. If crystallinity is present, a dark field mode image displays the crystallinity as bright (white) areas, such as bright areas 510 in FIG. 5B. Bright areas 510 represent areas of the multilayer that are wholly or partially crystalline and it was found that relatively little crystallinity was present in the multilayer 500 after annealing. The dark field image taken of multilayer 500 prior to exposing the multilayer to a temperature of 800° C. for 1 hour exhibits no recognizable bright areas, which indicates no crystallinity and demonstrates only nominal change in crystallinity after annealing, as shown in FIG. 5A. A comparison of the images of FIGS. 5A and 5B demonstrates that the $Mo_{1-x}N_x/Si_{1-y}N_y$ multilayer 500 is entirely amorphous before annealing and that the multilayer 500 remains substantially amorphous after annealing at 800° C.

Figure 6A:
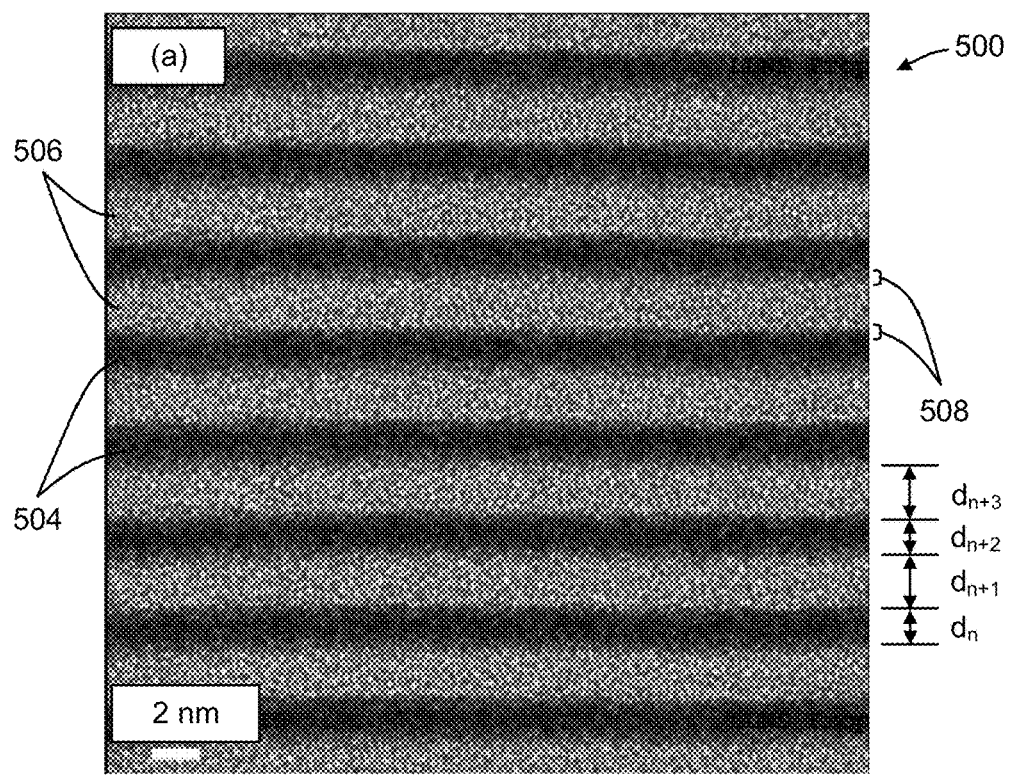
FIG. 6A is a cross-sectional image, obtained by transmission electron microscopy in bright field mode, of the aperiodic $Mo_{1-x}N_x/Si_{1-y}N_y$ multilayer of FIG. 5A, generally corresponding to Detail A, before exposing the $Mo_{1-x}N_x/Si_{1-y}N_y$ multilayer to a temperature of 800° C. for 1 hour, according to one illustrative configuration of the present invention.
Figure 6B:
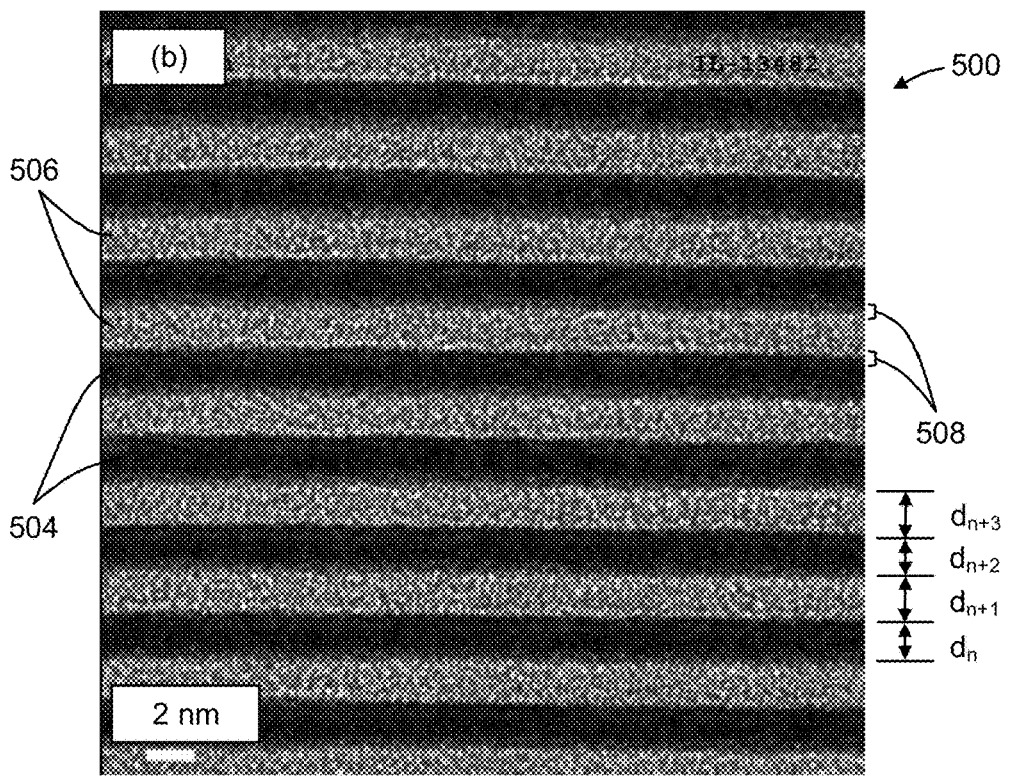
FIG. 6B is a cross-sectional image, obtained by transmission electron microscopy in bright field mode, of the $Mo_{1-x}N_x/Si_{1-y}N_y$ multilayer of FIG. 5B, generally corresponding to Detail B, after exposing the $Mo_{1-x}N_x/Si_{1-y}N_y$ multilayer to a temperature of 800° C. for 1 hour, according to one illustrative configuration of the present invention.

FIGS. 6A and 6B show magnified cross-sectional images, corresponding to Detail A of FIG. 5A and Detail B of FIG. 5B, respectively. The images of FIGS. 6A and 6B were obtained by transmission electron microscopy using a "bright field" mode to inspect the distinction between the $Mo_{1-x}N_x$ and $Si_{1-y}N_y$ layers. FIG. 6A shows the $Mo_{1-x}N_x/Si_{1-y}N_y$ multilayer 500 before annealing by exposing the $Mo_{1-x}N_x/Si_{1-y}N_y$ multilayer 500 to a temperature of 800° C. for 1 hour, in accordance with one aspect. FIG. 6B shows the same $Mo_{1-x}N_x/Si_{1-y}N_y$ multilayer 500 after annealing by exposing the $Mo_{1-x}N_x/Si_{1-y}N_y$ multilayer 500 to a temperature of 800° C. for 1 hour, in accordance with one aspect. As shown, the quality, and thicknesses, of the interfaces 508 appear to be maintained after the exposure to a temperature of 800° C. for 1 hour so that the separation between the $Mo_{1-x}N_x$ and $Si_{1-y}N_y$ layers remains well defined after annealing. It is believed that the reflectivity of the multilayer remains stable after the annealing due to the stability of the interfaces and the substantially amorphous nature of the layers within the multilayer.

In a preferred configuration, the $Mo_{1-x}N_x$ and $Si_{1-y}N_y$ layers are produced by $N_2$ reactive magnetron sputtering from pure Mo and Si targets, respectively. Reactive sputtering according to this configuration includes the introduction of a reactive gas (e.g., $N_2$), along with an inert gas (e.g., argon (Ar)), during thin film deposition. Conventional reactive magnetron sputtering equipment may be used. In one preferred approach, the mixture of nitrogen and argon in the process gas is up to 35% nitrogen. The foregoing reactive sputtering process incorporates nitrogen and the formation of nitrides in the films being deposited. The foregoing reactive sputtering process is used to fabricate reflective $Mo_{1-x}N_x/Si_{1-y}N_y$ multilayer coatings. Reactive sputtering may be employed in $Mo_{1-x}N_x/Si_{1-y}N_y$ multilayer coatings fabrication to control thin film composition, thin film stoichiometry, microstructure, growth rates, optical properties/refractive index, reduce stress, etc.

Without wishing to be bound to any theory, the inventors believe that the presence of nitrogen incorporated in the Mo and Si films, partially or wholly in the form of nitrides, prevents and/or greatly reduces the formation of the well-known molybdenum silicides ($MoSi_2$) which form in conventional Mo/Si multilayers at the layer interfaces which limit the achievable reflectivity and make the layered structure vulnerable to temperatures above 100° C. The presence of nitrides (e.g., $Mo_{1-x}N_x$ and $Si_{1-y}N_y$, instead of pure Mo and Si) potentially make the interfaces and the film relatively more stable when exposed to high temperatures compared to conventional multilayers described in detail above. Specifically, the inventors believe that the amorphous layer nature and stable layer interfaces are due to the introduction of $N_2$ gas during reactive sputtering in DC or RF magnetron sputtered Mo/Si coatings, resulting in incorporation of nitrogen in the films.

In one approach, $Mo_{1-x}N_x/Si_{1-y}N_y$ multilayer samples are deposited under the same conditions, with a mixture of 75% Ar and 25% $N_2$. Without wishing to be bound to any particular theory, the inventors believe that the $N_2$ gas fraction used during the coating fabrication process may be optimized to further increase the multilayer reflectivity at a given wavelength of operation in a wide spectral range from EUV to hard x-ray and to further improve multilayer stability at temperatures even higher than 800° C. During such an optimization, the trade-off considered with the introduction of $N_2$ is the possible loss (or improvement, depending on photon energy range) of optical contrast vs. the reduction of interface width and the improvement of interface stability, which leads to high reflectivity and high thermal stability.

Figure 7:
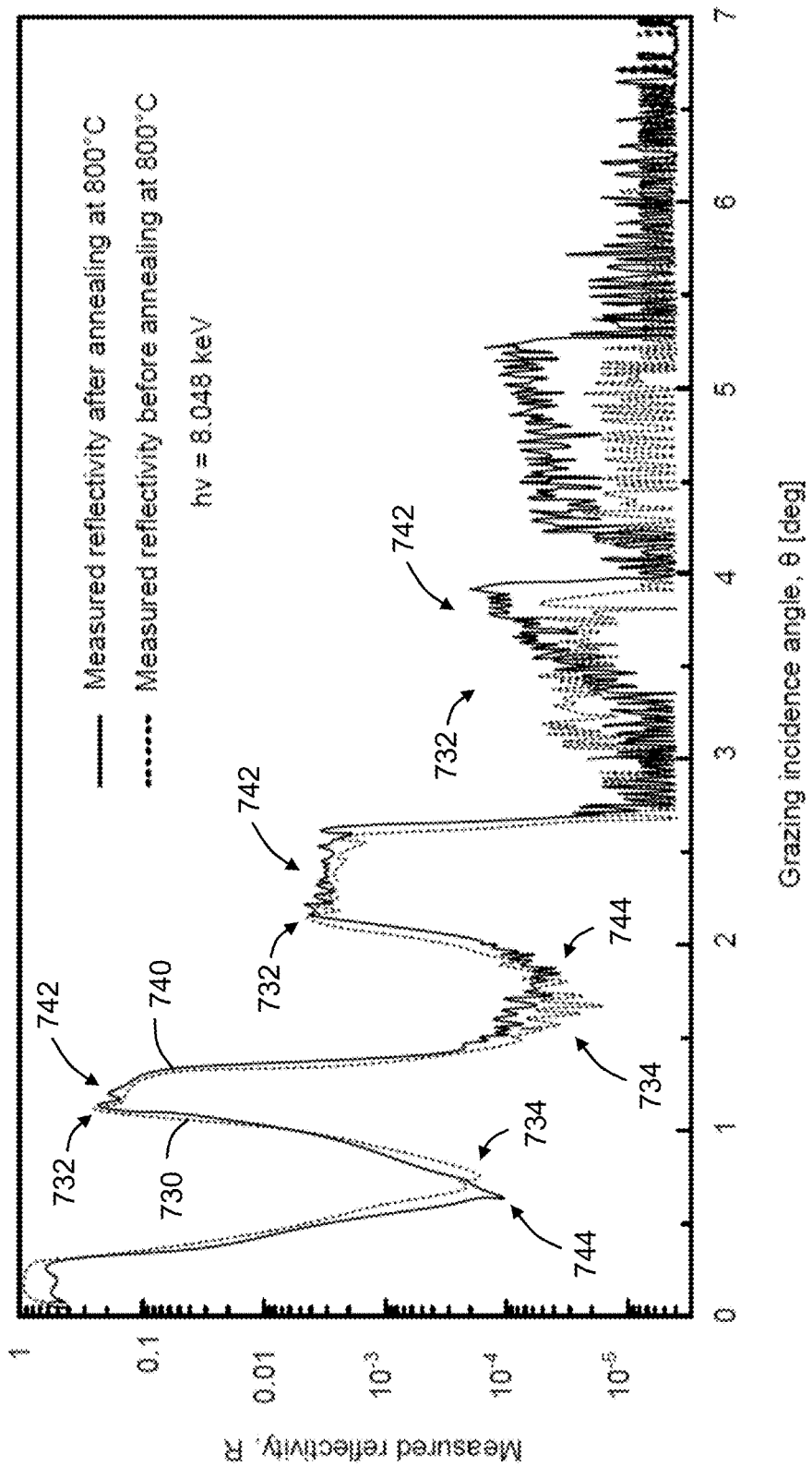
FIG. 7 is a graph of measured reflectivity vs. incidence angle of an exemplary $Mo_{1-x}N_x/Si_{1-y}N_y$ multilayer sample at a photon energy of 8.048 keV before and after annealing at a temperature of 800° C., according to one illustrative configuration of the present invention.

FIG. 7 is a graph of measured reflectivity (shown on a logarithmic scale) vs. incidence angle of a $Mo_{1-x}N_x/Si_{1-y}N_y$ multilayer sample at a photon energy of 8.048 keV. The graph illustrates a plot 730 of the reflectivity performance of the multilayer sample before annealing at a temperature of 800° C. and a plot 740 of the reflectivity performance of the multilayer sample after annealing at a temperature of 800° C., according to one aspect of the present invention. Specifically, FIG. 7 shows the measured reflectivity of the $Mo_{1-x}N_x/Si_{1-y}N_y$ multilayer sample before and after annealing at a temperature of 800° C. for 1 hour so that the reflectivity performance could be compared. In the graph, the peaks correspond to different orders of the reflection. For example, the graph illustrates a first order of the reflection of the multilayer sample at an incidence angle θ in a range from about 1.0° to about 1.25° both before and after annealing. The shape and reflectivity magnitudes of plot 730 closely match the shape and reflectivity magnitudes of plot 740 which indicates that the reflectivity performance of the multilayer sample did not change significantly. In particular, the peaks 732 and valleys 734 of plot 730 substantially align with the peaks 742 and valleys 744 of plot 740, and the reflectivity magnitudes of the peaks and valleys of the respective plots are substantially the same. The graph demonstrates that after annealing the multilayer, the measured reflectivity profile remains stable compared to the initial, pre-annealing reflective performance (e.g., the reflective performance does not decrease post-annealing as would be expected by one having ordinary skill in the art).

Figure 8:
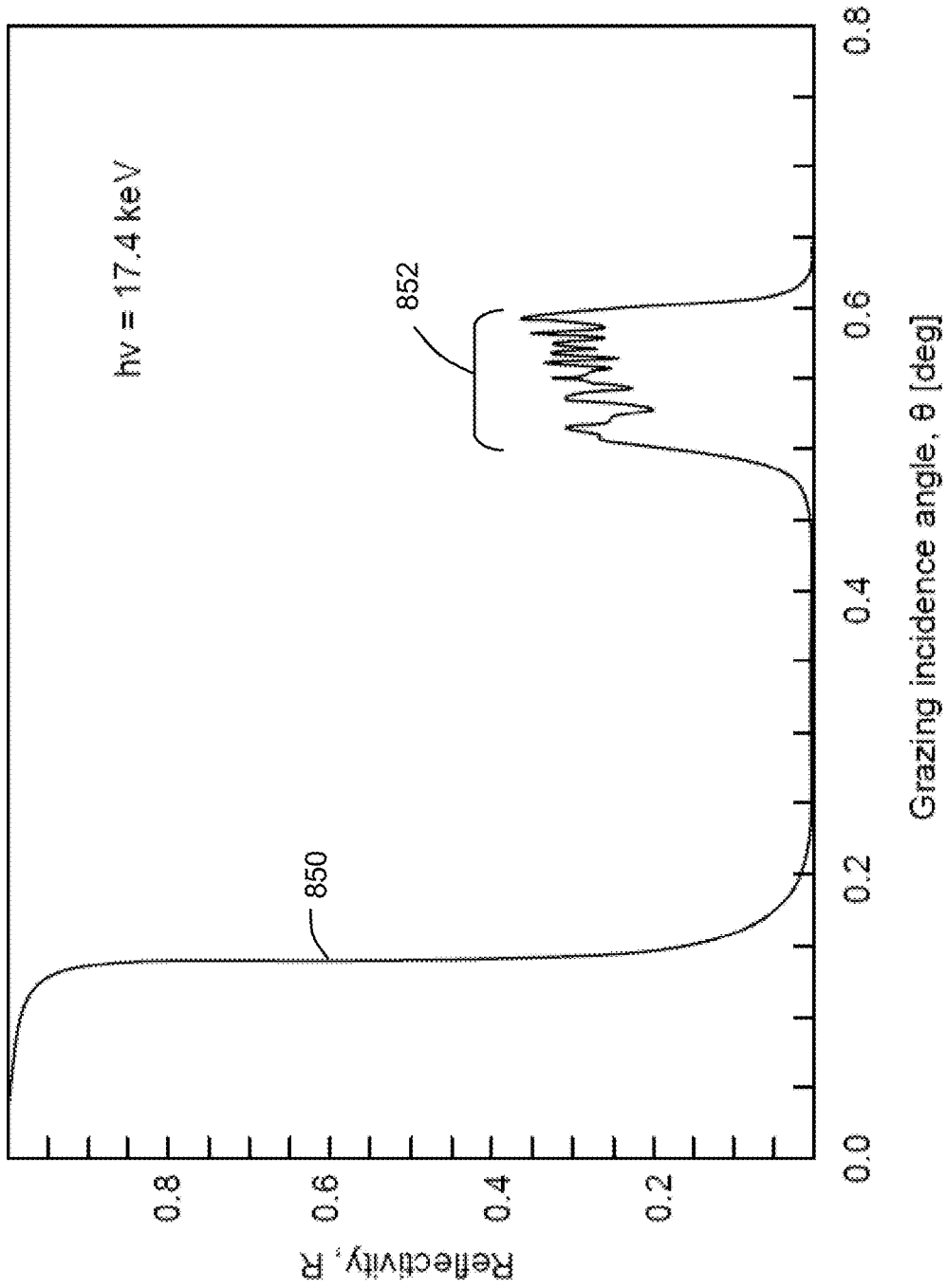
FIG. 8 is a graph illustrating a plot of target reflectivity performance vs. incidence angle for a model design showing the reflectivity vs. incidence angle for an exemplary $Mo_{1-x}N_x/Si_{1-y}N_y$ multilayer sample operating at a photon energy of 17.4 keV, according to one illustrative configuration of the present invention.

FIG. 8 is graph illustrating a plot 850 of target reflectivity performance (shown on a linear scale) vs. incidence angle for a model design for a $Mo_{1-x}N_x/Si_{1-y}N_y$ multilayer operating at 17.4 keV photon energy, according to one aspect of the present disclosure. As shown in FIG. 7, a multilayer sample was deposited, and its reflectivity was measured at 8.048 keV. Using the experimental data represented in FIG. 7 as well as analyses of the chemistry and composition of the layers in the $Mo_{1-x}N_x/Si_{1-y}N_y$ coating, a realistic model was developed using simulations for the coating at 17.4 keV. The result is a multilayer with first order reflectivity having angular bandwidth 852 from 0.5° to 0.6° grazing incidence angle θ and 27% average reflectivity R at 17.4 keV.

Using the parameters of the model created in FIG. 8 for the coating at 17.4 keV, a projected design for 92 eV near normal incidence yields a peak reflectivity in the range 45-65%, with possibility of further improvement using additional process optimizations, according to at least some of the various approaches described herein.

In general, depending on photon energy, an increase of the N content inside the multilayer film may increase (or decrease) the optical contrast between the layers resulting in an increase (or decrease) of reflectivity, respectively. Furthermore, an increase of the N content (up to a point, depending on the material) inside the film may reduce the interface width and increase the stability of the interfaces, presumably due to formation of nitrides or other mechanisms. The reduction of interface width and increased stability of the interfaces result in high reflectivity both at room temperature and high temperatures. There may be a specific N concentration inside the film beyond which an improvement of the interface width and stability of the interfaces does not occur anymore. In preferred configurations, a $Mo_{1-x}N_x/Si_{1-y}N_y$ multilayer product comprises a first layer consisting essentially of $Mo_{1-x}N_x$ where x=0 to 0.4. The $Mo_{1-x}N_x/Si_{1-y}N_y$ multilayer product comprises a second layer consisting essentially of $Si_{1-y}N_y$ where y=0 to 0.4.

In another preferred configuration, a $Mo_{1-x}N_x/Si_{1-y}N_y$ multilayer product comprises a first layer consisting essentially of $Mo_{1-x}N_x$ where x=0 to 0.6. The $Mo_{1-x}N_x/Si_{1-y}N_y$ multilayer product comprises a second layer consisting essentially of $Si_{1-y}N_y$ where y=0 to 0.6.

In another configuration, a product comprises a single layer consisting essentially of $Mo_{1-x}N_x$ where x=0 to 0.8. In one preferred approach, the product comprises single layer consisting essentially of $Mo_{1-x}N_x$ where x=0 to 0.6. The single layer may be any thickness as would be understood by one having ordinary skill in the art in view of the present disclosure and the intended application. The single layer may comprise sub-layers consisting essentially of $Mo_{1-x}N_x$ where x=0 to 0.8 to achieve a desired thickness, according to at least some approaches. The single layer consisting essentially of $Mo_{1-x}N_x$ may be formed according to any of the approaches described herein, especially with respect to method 900 (described in detail below).

In yet another configuration, a product comprises a single layer consisting essentially of $Si_{1-y}N_y$ where y=0 to 0.8. In one preferred approach, the product comprises single layer consisting essentially of $Si_{1-y}N_y$ where y=0 to 0.6. The single layer may be any thickness as would be understood by one having ordinary skill in the art in view of the present disclosure and the intended application. The single layer may comprise sub-layers consisting essentially of $Si_{1-y}N_y$ where y=0 to 0.8 to achieve a desired thickness, according to at least some approaches. The single layer consisting essentially of $Si_{1-y}N_y$ may be formed according to any of the approaches described herein, especially with respect to method 900 (described in detail below).

Any of the foregoing products may be implemented in conjunction with features from any other approach listed herein, such as those discussed with reference to other FIGS. Of course, however, such products and others presented herein may be used in various applications and/or in permutations which may or may not be specifically described in the illustrative configurations listed herein. The products presented herein may be used in any desired environment and/or application.

Figure 9:
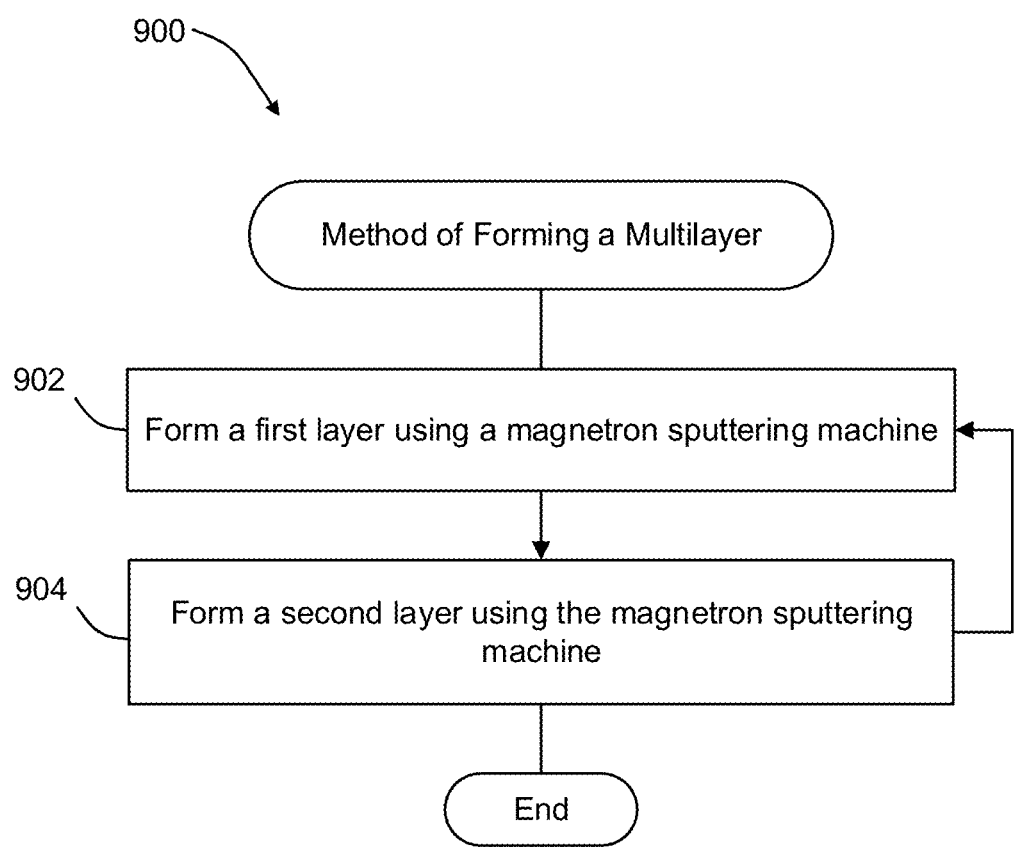
FIG. 9 is a flowchart of a method, according to one illustrative configuration of the present invention.

FIG. 9 shows a method 900, in accordance with one aspect. As an option, the present method 900 may be implemented to form a product in accordance with various approaches described herein. Of course, however, this method 900 and others presented herein may be used to form a product which may or may not be related to the illustrative aspects listed herein. Moreover, more, or fewer operations than those shown in FIG. 9 may be included in method 900, according to various aspects. It should also be noted that any of the aforementioned features may be used in any of the aspects described in accordance with the various methods.

Operation 902 includes forming a first layer using a magnetron sputtering machine. The magnetron sputtering machine may be a direct current (DC) or a radio frequency (RF) magnetron sputtering machine. In preferred configurations, forming the first layer using the DC or RF magnetron sputtering machine uses a mixture of inert gas and a reactive gas. In a preferred approach, the reactive gas is $N_2$. In one exemplary approach, forming the first layer uses a mixture of 25% $N_2$ in argon. The target of the DC or RF magnetron sputtering machine is preferably pure Mo.

Operation 904 includes forming a second layer using a magnetron sputtering machine. The magnetron sputtering machine may be the same or different magnetron sputtering machine used to form the first layer. The magnetron sputtering machine may be a direct current (DC) or a radio frequency (RF) magnetron sputtering machine. In preferred configurations, forming the second layer using the DC or RF magnetron sputtering machine uses a mixture of inert gas and a reactive gas. In a preferred approach, the reactive gas is $N_2$. In one exemplary approach, forming the second layer uses a mixture of 25% $N_2$ in argon. The target of the DC or RF magnetron sputtering machine is preferably pure Si.

It should be understood by one having ordinary skill in the art that the first layer and the second layer may be formed in any order and the order of operations described herein does not imply any required order of formation.

The DC or RF magnetron sputtering machine is optimized to produce extremely smooth, extremely precise, and extremely pure thin film coatings. Typically, the sputtering target materials have 99.95% atomic or better purity, the base pressure in the deposition chamber is $5 \times 10^{-7}$ Torr or lower and the process gas pressure is in the range of 1 mTorr to 5 mTorr. In various approaches, one having ordinary skill in the art would know how to tune a standard DC or RF magnetron sputtering machine for such optimizations.

In some configurations, the first layer consists essentially of $Mo_{1-x}N_x$ where x=0 to 0.6. In one preferred configuration, the first layer consists essentially of $Mo_{1-x}N_x$ where x=0.2 to 0.6. In various configurations, the second layer consists essentially of $Si_{1-y}N_y$ where y=0 to 0.6. In one preferred configuration, the second layer consists essentially of $Si_{1-y}N_y$ where y=0.2 to 0.6. In preferred approaches, x>0 when y=0 and y>0 when x=0.

In various configurations, the first layer and the second layer may be formed in any order. For example, the first layer may consist essentially of $Si_{1-y}N_y$ where y=0 to 0.6 and the second layer may consist essentially of $Mo_{1-x}N_x$ where x=0 to 0.6.

In other approaches, method 900 may include forming a single layer using a DC or RF magnetron sputtering machine. The single layer may consist essentially of $Mo_{1-x}N_x$ where x=0 to 0.6. Alternatively, the single layer may consist of $Si_{1-y}N_y$ where y=0 to 0.6. Furthermore, the atomic fraction of $N_2$ may vary across the thickness of the single layer.

In one approach, the first layer and/or the second layer may comprise 40 atomic % nitrogen. Specifically, about 40 atomic % nitrogen may be incorporated in the layers in response to using 25% nitrogen during the deposition process. It should be understood by one having ordinary skill in that art that the atomic % of nitrogen in the first layer and the second layer are each adjustable depending on the desired properties of the film.

In one approach, the first and second layer form a set having an interface therebetween. In various configurations, a plurality of the sets are formed in a laminate of the sets by repeating operations 902 and 904. The laminate of sets may include any number of sets, depending on the application. The thickness of the laminate of sets (e.g., and/or the thickness of the first and second layers forming the set) may be readily selectable by one having ordinary skill in the art in view of the intended application and the teachings of the present disclosure.

In various approaches, the nitrogen concentration of one or more of the layers varies along a thickness thereof according to a predefined recipe (e.g., a predefined gradient). In a preferred configuration, the nitrogen concentration of one or more of the layers varies along a deposition thickness thereof. The predefined recipe may refer to nitrogen concentrations of any value within a range spanning from 0% to 80%, throughout the sample, depending on the application. The percentage nitrogen concentration may be in atomic percentage, volume percentage, molar percentage, etc. The predefined nitrogen concentration profile may be readily determinable by one having ordinary skill in the art depending on the intended application in view of the present disclosure. Accordingly, the nitrogen may be turned on/off and/or reduced/increased during deposition of a single layer in order to create the predefined nitrogen concentration profile within the layer (e.g., along a deposition thickness thereof).

In preferred approaches, the nitrogen concentration in one of the layers of a first of the sets is different than a nitrogen concentration in a corresponding layer of a second of the sets. For example, the nitrogen concentration in a $Mo_{1-x}N_x$ layer (e.g., a first layer) in a first set may be different from a nitrogen concentration in a $Mo_{1-x}N_x$ layer (e.g., a first layer) in a second set. In one approach, within each repeating set of sub-layers, the nitrogen concentration may be the same or different. Moreover, the nitrogen concentrations of the layers in a given set may be different from the nitrogen concentrations of some, or all of the sub-layers of other sets.

In various configurations, x>0 when y=0 and y>0 when x=0. Accordingly, nitrogen may be turned on or off during deposition such that nitrogen is present in some layers and not present in other layers, and any permutation thereof.

In one exemplary layer formed by method 900, a 50 nm layer of $Si_{1-y}N_y$ may comprise sub-layers of alternating 5 nm layers of $Si_{1-y}N_y$ where y>0 and 5 nm layers of $Si_{1-y}N_y$ where y=0 (e.g., for a total of 10 sub-layers). One having ordinary skill in the art would appreciate that the sub-layers may be any thickness in order to further reduce crystallinity and/or achieve specific density values for the film (e.g., thereby increasing thermal stability and reflectivity and/or transmittance at room temperature and at high temperature).

In other approaches, the first layer and the second layer are each substantially amorphous or nanocrystalline. As used throughout the present disclosure, "nanocrystalline" refers to layers having a crystallite size of a few nanometers. In preferred approaches, nanocrystalline layers are characterized as solids with grain sizes in the range of 1 nm to 100 nm. In preferred approaches, the first layer and the second layer are each entirely amorphous.

In one approach, the first layer and the second layer are each characterized by maintaining a substantially amorphous nature upon annealing at 800° C. for 1 hour in a vacuum environment of $10^{-7}$ Torr. The crystallinity was verified before and after annealing by electron diffraction patterns and images in "dark field" mode as part of electron microscopy measurements.

According to various models, the interfacial roughness achieved by method 900 is in the range of about 2 Å to about 5.5 Å (0.2 nm-0.55 nm). The reflectivity reported in Sobieraj ski et al., of about 26% at 92 eV photon energy and about 28 deg incidence angle, corresponds to significantly increased interfacial roughness and/or interdiffusion of about 14 Å (1.4 nm) at each interface. As mentioned earlier, 26% reflectivity is considered too low to be practical for optical elements at 92 eV photon energy.

In one approach, the first layer and the second layer are each characterized by exhibiting a nominal change in reflectivity upon annealing at 800° C. for 1 hour. A nominal change in reflectivity refers to less than a 2% (relative) change in integrated reflectivity.

Without wishing to be bound by any theory, the inventors believe the lack of interdiffusion at the interfaces between the layers is mainly responsible for the high thermal stability of the presently disclosed multilayers. Furthermore, one theory includes additional stability due to stable compound(s) formed in response to performing the claimed method. The inventors found that the amorphous nature and the high thermal stability of the $Mo_{1-x}N_x/Si_{1-y}N_y$ multilayers when annealed up to 800° C., fabricated by the presently disclosed approaches, to be both surprising and unpredictable. The inventors were surprised that the layers maintained an amorphous nature and stable interfaces at 800° C. and did not predict that the layers would maintain the amorphous nature and stable interfaces at 800° C. The methods disclosed herein worked better than expected at producing $Mo_{1-x}N_x/Si_{1-y}N_y$ multilayers with high reflectivity and thermal stability at temperatures of at least 800° C., even when exposed to the elevated temperatures for an hour. Again, all known prior attempts to fabricating Mo/Si coatings with modified properties (e.g., interfaces, barriers, etc.) resulted in coatings with thermal stability up to 400° C., therefore lacking sufficient thermal stability for use at temperatures between 400° C. and 800° C. Moreover, the conventional Mo/Si coatings exhibit decreased reflectivity upon being heated to temperatures above 100-150° C. and dramatically decreased to near-zero reflectivity upon being heated to 800° C.

In Use

The foregoing exposure performance is believed to be the highest thermal stability recorded for multilayers operating in the EUV to hard x-ray spectral regions. At least some aspects of the highly reflective/highly thermally stable multilayers may be used in applications including EUV lithography, solar physics, astronomy, attosecond physics, x-ray lasers, synchrotron instrumentation, plasma physics, target diagnostics, etc. Any of the foregoing applications would benefit from multilayer coatings having high reflectivity and high thermal stability at high temperatures fabricated via the methods disclosed herein.

In various approaches, the thermally stable and highly reflective $Mo_{1-x}N_x/Si_{1-y}N_y$ multilayer coatings disclosed herein may be used as a reflective, transmissive, and/or diffractive coatings on mirrors, filters, gratings, polarizers, etc. $Mo_{1-x}N_x/Si_{1-y}N_y$ multilayer coatings disclosed herein may be used as protective coatings against thermal and/or radiation damage on optical surfaces. One specific advantage that the presently disclosed $Mo_{1-x}N_x/Si_{1-y}N_y$ multilayer coatings offer is to maintain high reflectivity under high temperature conditions. For example, some of the presently disclosed $Mo_{1-x}N_x/Si_{1-y}N_y$ multilayer coatings may be used as a collector and/or illuminator in optics placed in proximity to a high-temperature EUV/x-ray source, as part of optical systems under high-heat loads in EUV/x-ray synchrotron, in free-electron laser facilities, etc.

In some approaches, various configurations described herein may be used in EUV lithography as a pellicle and/or transmissive membrane. Specifically, the $Si_{1-y}N_y$ layers could be useful for protecting the mask during the lithography process due to their amorphous nature, stable interfaces, and high thermal stability. Almost all conventional materials form new phases in high temperatures (e.g., increased crystallinity due to the high energy system). $Mo_{1-x}N_x/Si_{1-y}N_y$ multilayers formed by the processes described herein do not exhibit phase changes and/or increased crystallinity at elevated temperatures, thereby making the $Mo_{1-x}N_x/Si_{1-y}N_y$ multilayers useful for EUV lithography.

The inventive concepts disclosed herein have been presented by way of example to illustrate the myriad features thereof in a plurality of illustrative scenarios, aspects, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various aspects have been described above, it should be understood that they have been presented by way of example only, and not limitation. Thus, the breadth and scope of an aspect of the present invention should not be limited by any of the above-described exemplary aspects, but should be defined only in accordance with the following claims and their equivalents.

What is claimed is:

1. A product, comprising:
   a first layer consisting essentially of $Mo_{1-x}N_x$, where x=greater than 0 to 0.8; and
   a second layer formed directly adjacent the first layer, the second layer consisting essentially of $Si_{1-y}N_y$, where y=greater than 0 to 0.8,
   wherein the first layer is substantially amorphous or is substantially nanocrystalline, wherein the first layer and the second layer form a set having an interface therebetween, wherein a plurality of sets is present in a laminate of the sets.

2. The product as recited in claim 1, wherein x=0.2 to 0.6, wherein y=0.2 to 0.6.

3. The product as recited in claim 1, wherein the first layer and the second layer are each substantially amorphous.

4. The product as recited in claim 1, wherein the first layer and the second layer are each characterized as maintaining a substantially amorphous nature upon annealing at 800° C. for 1 hour.

5. The product as recited in claim 1, wherein the first layer and the second layer are each characterized as exhibiting a nominal change in reflectivity upon annealing at 800° C. for 1 hour.

6. The product as recited in claim 1, wherein a nitrogen concentration in one of the layers varies along a thickness thereof according to a predefined gradient.

7. The product as recited in claim 1, wherein the first layer is substantially amorphous, wherein the first layer and the second layer are each characterized as exhibiting a nominal change in reflectivity upon annealing at 800° C. for 1 hour.

8. The product as recited in claim 1, wherein a nitrogen concentration in one of the layers of a first of the sets is different than a nitrogen concentration in a corresponding layer of a second of the sets.

9. A product, comprising:
a layer positioned directly on a previously-formed top surface of a second layer, the layer consisting essentially of $Mo_{1-x}N_x$, where x=greater than 0.1 to 0.8, the second layer having a different composition than Mo,
wherein the layer is characterized by exhibiting a nominal change in reflectivity upon annealing at 800° C. for 1 hour,
wherein the layer is substantially amorphous,
wherein the second layer is characterized by maintaining a substantially amorphous nature upon annealing at 800° C. for 1 hour.

10. The product as recited in claim 9, wherein x=0.2 to 0.6, wherein an interface of the layer and the second layer is defined by the previously-formed top surface of the second layer, wherein the second layer is a sputtered layer.

11. The product as recited in claim 9, comprising a laminate of discrete ones of the layers and second layers formed in sequence and in direct contact with each other, wherein the layer has physical characteristics of formation of growth in a direction away from the previously-formed top surface of the second layer.

12. The product as recited in claim 9, wherein the layer is characterized by maintaining a substantially amorphous nature upon annealing at 800° C. for 1 hour, wherein the second layer consists of a material other than Mo.

13. The product as recited in claim 9, wherein a nitrogen concentration in the layer varies along a thickness thereof according to a predefined gradient.

14. The product as recited in claim 9, comprising:
the second layer positioned directly adjacent the layer, the second layer consisting essentially of $Si_{1-y}N_y$, where y=greater than 0 to 0.8,
wherein the layer and the second layer form a set having an interface therebetween,
wherein a plurality of sets is present in a laminate of the sets.

15. A product, comprising:
a set of laminated first and second layers arranged in an alternating fashion,
the first layers consisting essentially of $Mo_{1-x}N_x$, where x=greater than 0 to 0.8; and
the second layers consisting essentially of $Si_{1-y}N_y$, where y=greater than 0 to 0.8,
wherein the set of laminated first and second layers is characterized as having greater than 50% reflectivity of light in the extreme ultraviolet range at near-normal incidence,
wherein the set of laminated first and second layers is characterized by exhibiting a nominal change in reflectivity upon annealing at 800° C. for 1 hour,
wherein the second layers are characterized by maintaining a substantially amorphous nature upon annealing at 800° C. for 1 hour.

16. The product as recited in claim 15, wherein y=0.2 to 0.6, wherein the layers in the set are directly adjacent one another at all points therealong.

17. The product as recited in claim 15, wherein y=greater than 0 to 0.4.

18. The product as recited in claim 15, wherein the second layers are sputtered layers.

19. The product as recited in claim 15, wherein a nitrogen concentration in one or more of the second layers varies along a thickness thereof according to a predefined gradient.

20. A method, comprising:
forming a first layer and a second layer using a magnetron sputtering machine,
wherein the first layer consists essentially of $Mo_{1-x}N_x$, where x=greater than 0 to 0.8,
wherein the second layer consists essentially of $Si_{1-y}N_y$, where y=greater than 0 to 0.8,
wherein the first layer and the second layer are each characterized as maintaining a substantially amorphous nature upon annealing at 800° C. for 1 hour.

21. The method as recited in claim 20, wherein the first layer and the second layer form a set having an interface therebetween, wherein a plurality of sets is present in a laminate of the sets, wherein a nitrogen concentration in one of the layers of a first of the sets is different than a nitrogen concentration in a corresponding layer of a second of the sets, wherein the first and second layers are substantially amorphous as formed.

* * * * *